United States Patent
Horimoto et al.

(10) Patent No.: US 12,384,902 B2
(45) Date of Patent: Aug. 12, 2025

(54) INSULATING PASTE

(71) Applicant: SUMITOMO BAKELITE CO., LTD., Tokyo (JP)

(72) Inventors: Akihiro Horimoto, Tokyo (JP); Mayo Miyachi, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 977 days.

(21) Appl. No.: 17/276,161

(22) PCT Filed: Sep. 26, 2018

(86) PCT No.: PCT/JP2018/035773
§ 371 (c)(1),
(2) Date: Mar. 15, 2021

(87) PCT Pub. No.: WO2020/065785
PCT Pub. Date: Apr. 2, 2020

(65) Prior Publication Data
US 2021/0269618 A1  Sep. 2, 2021

(51) Int. Cl.
*C08K 3/36* (2006.01)
*H05K 1/03* (2006.01)
*H05K 1/02* (2006.01)

(52) U.S. Cl.
CPC .............. *C08K 3/36* (2013.01); *H05K 1/0373* (2013.01); *H05K 1/0283* (2013.01); *Y10T 428/2995* (2015.01)

(58) Field of Classification Search
CPC ........................................................ C08K 3/36
USPC ..................................................... 528/15, 31
See application file for complete search history.

(56) References Cited

U.S. PATENT DOCUMENTS

| | | | |
|---|---|---|---|
| 4,357,436 A * | 11/1982 | Zucker | C08K 3/36 524/448 |
| 9,724,451 B2 | 8/2017 | Senoo et al. | |
| 10,072,177 B2 | 9/2018 | Burrows | |
| 10,381,547 B2 | 8/2019 | Takamatsu | |
| 2004/0110863 A1* | 6/2004 | Zech | C08L 83/04 523/109 |
| 2008/0233416 A1* | 9/2008 | Takase | C04B 35/63424 427/372.2 |
| 2014/0018464 A1* | 1/2014 | Senoo | A61L 29/042 523/105 |
| 2016/0351289 A1* | 12/2016 | Orita | H01B 1/22 |

FOREIGN PATENT DOCUMENTS

| | | |
|---|---|---|
| CN | 103562322 | 2/2014 |
| JP | 2013-072063 | 4/2013 |
| JP | 2015-055615 | 3/2015 |
| JP | 2017-117861 | 6/2017 |
| JP | 2017-533333 | 11/2017 |

OTHER PUBLICATIONS

International Search Report and Written Opinion for International Application No. PCT/JP2018/035773 mailed on Nov. 20, 2018, 5 pages.

* cited by examiner

*Primary Examiner* — Margaret G Moore
(74) *Attorney, Agent, or Firm* — Amin, Turocy & Watson, LLP

(57) ABSTRACT

An insulating paste of the present invention contains an elastomer composition containing silica particles (C) and a solvent.

16 Claims, 2 Drawing Sheets

INSULATING PASTE

TECHNICAL FIELD

The present invention relates to an insulating paste.

BACKGROUND ART

In recent years, a variety of development efforts regarding materials used for substrates that constitute stretchable wiring substrates have been underway. As this type of technique, for example, a technique described in Patent Document 1 is known. According to the same publication, it is described that silicone rubber is obtained by, as a production method of an elastomer base material, heating a kneaded substance obtained by kneading a silicone rubber polymer and a crosslinking agent with far-infrared rays at 150° C. for five minutes (Paragraph 0037 of Patent Document 1).

RELATED DOCUMENT

Patent Document

[Patent Document 1] Japanese Unexamined Patent Publication No. 2015-55615

SUMMARY OF THE INVENTION

However, as a result of the present inventors' studies, it was clarified that the kneaded substance that is used for the silicone rubber described in Patent Document 1 has room for improvement in the film-forming property or the stretch durability.

As a result of additional studies, the present inventors found that, when silica particles are further added to an insulating paste containing an elastomer composition and a solvent, it is possible to improve the film-forming property and the stretch durability in insulating resin films such as substrates for which the insulating paste is used and completed the present invention.

According to the present invention, there is provided an insulating paste containing an elastomer composition containing silica particles (C), and a solvent.

According to the present invention, it is possible to provide an insulating paste being excellent in terms of the film-forming property and the stretch durability.

BRIEF DESCRIPTION OF THE DRAWINGS

The above-described object, other objects, features, and advantages will be further clarified using a preferred embodiment described below and the following drawings attached thereto.

DESCRIPTION OF EMBODIMENTS

Figure 1:
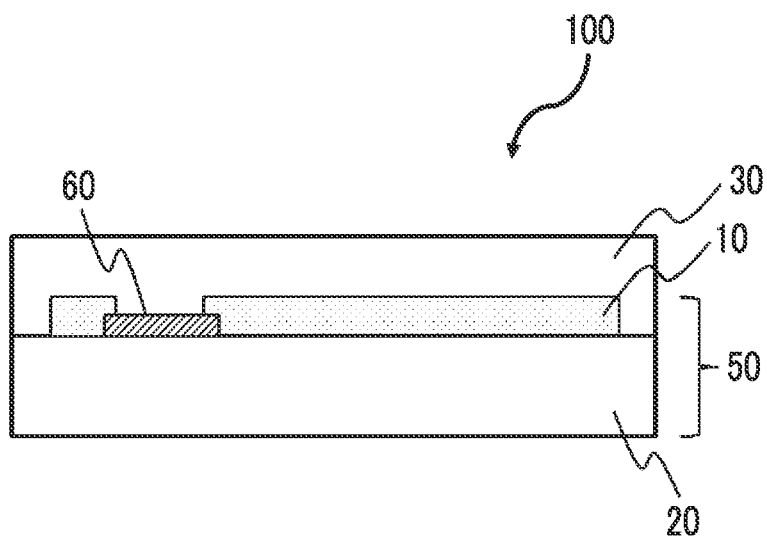
FIG. 1 is a cross-sectional view schematically showing an electronic device in the present embodiment.

Hereinafter, an embodiment of the present invention will be described using drawings. It should be noted that, in all of the drawings, the same constitution element will be given the same reference sign and description thereof will not be repeated. In addition, in the present specification, "to" indicates equal to or more than and equal to or less than unless particularly otherwise described.

The brief overview of an insulating paste of the present embodiment will be described.

The insulating paste of the present embodiment is capable of containing an elastomer composition containing silica particles (C) and a solvent.

The insulating paste of the present embodiment is made from a paste-form insulating resin composition containing a solvent and is thus excellent in terms of the applicability or the film-forming property with respect to supporting base materials. This insulating paste contains silica particles (C) and is thus capable of enhancing the mechanical strength and durability of a cured substance of the insulating paste. When an insulating resin film that constitutes a stretchable wiring substrate is produced using the above-described insulating paste, it is possible to improve the mechanical strength or durability of the insulating resin film. Therefore, the insulating paste of the present embodiment can be suitable for use for forming, for example, substrates that constitute stretchable wiring substrates.

Hereinafter, each component of the insulating paste of the present embodiment will be described.

The insulating paste of the present embodiment is capable of containing an elastomer composition. Therefore, even when a stretchable substrate or the like is produced with the insulating paste, it is possible to develop an appropriate stretch property for the stretchable substrate. In addition, the insulating paste of the present embodiment is capable of containing silica particles (C). Therefore, it is possible to improve the mechanical strength of the stretchable substrate.

The elastomer composition is a substance used for the formation of the above-described stretchable substrate, is capable of containing, for example, a thermosetting elastomer composition used for the formation of one or more thermosetting elastomers selected from the group consisting of silicone rubber, urethane rubber, and fluorine rubber, and is preferably capable of containing a silicone rubber-based curable composition.

As the elastomer, it is possible to use silicone rubber, urethane rubber, fluorine rubber, nitrile rubber, acrylic rubber, styrene rubber, chloroprene rubber, ethylene propylene rubber, or the like. Among these, the elastomer is capable of containing one or more thermosetting elastomers selected from the group consisting of silicone rubber, urethane rubber, and fluorine rubber. In addition, the elastomer is capable of containing silicone rubber since the silicone rubber is chemically stable and is also excellent in terms of the mechanical strength.

The thermosetting elastomer can be made from a cured substance of a thermosetting elastomer composition. For example, the silicone rubber can be made from a cured substance of a silicone rubber-based curable composition. It should be noted that a thermoplastic elastomer can be made from a dried substance of the thermoplastic elastomer. In the present specification, an elastomer made from the insulating paste refers to an insulating elastomer formed by drying or curing the insulating paste.

Hereinafter, the case of using a silicone rubber-based curable composition as the silicone rubber, which is an example of the elastomer of the present embodiment, will be described.

The silicone rubber-based curable composition of the present embodiment is capable of containing a vinyl group-containing organopolysiloxane (A). The vinyl group-containing organopolysiloxane (A) is a polymer that serves as a main component of the silicone rubber-based curable composition of the present embodiment.

The vinyl group-containing organopolysiloxane (A) is capable of containing a vinyl group-containing straight-chain organopolysiloxane (A1) having a straight-chain structure.

The vinyl group-containing straight-chain organopolysiloxane (A1) has a straight-chain structure and contains a vinyl group, and such a vinyl group serves as a crosslinking point during the curing of the silicone rubber-based curable composition.

The content of the vinyl group in the vinyl group-containing straight-chain organopolysiloxane (A1) is not particularly limited, but the vinyl group-containing straight-chain organopolysiloxane (A1) preferably has two or more vinyl groups in the molecule and has a content of the vinyl groups of equal to or less than 15 mol % and more preferably has a content of the vinyl groups of 0.01 to 12 mol %. In such a case, the amount of the vinyl groups in the vinyl group-containing straight-chain organopolysiloxane (A1) is optimized, and it is possible to reliably form a network with individual components described below. In the present embodiment, "to" used to express a numerical range indicates that numerical values on both ends are included in the range.

It should be noted that, in the present specification, a vinyl group content refers to the mole percentage of a vinyl group-containing siloxane unit when the content of all units that constitute the vinyl group-containing straight-chain organopolysiloxane (A1) is set to 100 mol %. Here, one vinyl group-containing siloxane unit is considered as one vinyl group.

In addition, the degree of polymerization of the vinyl group-containing straight-chain organopolysiloxane (A1) is not particularly limited, but is, for example, preferably in a range of approximately 1,000 to 10,000 and more preferably in a range of approximately 2,000 to 5,000. It should be noted that, the degree of polymerization can be obtained as, for example, the polystyrene-equivalent number-average degree of polymerization (or number-average molecular weight) or the like in gel permeation chromatography (GPC) in which chloroform is used as a developing solvent.

Furthermore, the specific gravity of the vinyl group-containing straight-chain organopolysiloxane (A1) is not particularly limited, but is preferably in a range of approximately 0.9 to 1.1.

When a vinyl group-containing straight-chain organopolysiloxane having a degree of polymerization and a specific gravity in the above-described ranges is used as the vinyl group-containing straight-chain organopolysiloxane (A1), it is possible to improve the heat resistance, flame retardancy, chemical stability, and the like of silicone rubber to be obtained.

As the vinyl group-containing straight-chain organopolysiloxane (A1), particularly, a vinyl group-containing straight-chain organopolysiloxane having a structure represented by Formula (1) is preferred.

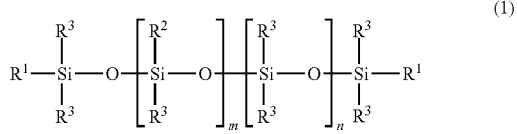

(1)

In Formula (1), $R^1$ is a substituted or unsubstituted alkyl group, alkenyl group, or aryl group having 1 to 10 carbon atoms or a hydrocarbon group formed by combining the above-described groups. As the alkyl group having 1 to 10 carbon atoms, for example, a methyl group, an ethyl group, a propyl group, and the like are exemplified, and, among these, a methyl group is preferred. As the alkenyl group having 1 to 10 carbon atoms, for example, a vinyl group, an allyl group, a butenyl group, and the like are exemplified, and, among these, a vinyl group is preferred. As the aryl group having 1 to 10 carbon atoms, for example, a phenyl group and the like are exemplified.

In addition, $R^2$ is a substituted or unsubstituted alkyl group, alkenyl group, or aryl group having 1 to 10 carbon atoms or a hydrocarbon group formed by combining the above-described groups. As the alkyl group having 1 to 10 carbon atoms, for example, a methyl group, an ethyl group, a propyl group, and the like are exemplified, and, among these, a methyl group is preferred. As the alkenyl group having 1 to 10 carbon atoms, for example, a vinyl group, an allyl group, and a butenyl group are exemplified. As the aryl group having 1 to 10 carbon atoms, for example, a phenyl group is exemplified.

In addition, $R^3$ is a substituted or unsubstituted alkyl group or aryl group having 1 to 8 carbon atoms or a hydrocarbon group formed by combining the above-described groups. As the alkyl group having 1 to 8 carbon atoms, for example, a methyl group, an ethyl group, a propyl group, and the like are exemplified, and, among these, a methyl group is preferred. As the aryl group having 1 to 8 carbon atoms, for example, a phenyl group is exemplified.

Furthermore, as a substituent in $R^1$ and $R^2$ in Formula (1), for example, a methyl group, a vinyl group, and the like are exemplified, and, as a substituent in $R^3$, for example, a methyl group and the like are exemplified.

It should be noted that, in Formula (1), a plurality of $R^1$'s is groups independent from each other and may be different from or identical to each other. Furthermore, this is also true for $R^2$'s and $R^3$'s.

Furthermore, m and n are the numbers of repeating units that constitute the vinyl group-containing straight-chain organopolysiloxane (A1) represented by Formula (1), m is an integer of 0 to 2,000, and n is an integer of 1,000 to 10,000. m is preferably 0 to 1,000, and n is preferably 2,000 to 5,000.

In addition, as a specific structure of the vinyl group-containing straight-chain organopolysiloxane (A1) represented by Formula (1), for example, a structure represented by Formula (1-1) is exemplified.

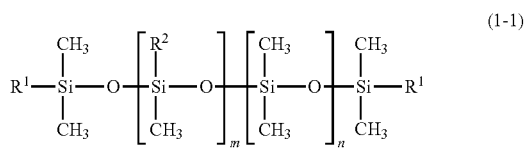

(1-1)

In Formula (1-1), $R^1$ and $R^2$ are each independently a methyl group or a vinyl group, and at least one is a vinyl group.

Furthermore, as the vinyl group-containing straight-chain organopolysiloxane (A1), a vinyl group-containing straight-chain organopolysiloxane containing a first vinyl group-containing straight-chain organopolysiloxane (A1-1) having two or more vinyl groups in the molecule in a vinyl group content of equal to or less than 0.4 mol % and a second vinyl group-containing straight-chain organopolysiloxane (A1-2) having a vinyl group content of 0.5 to 15 mol % is preferred. When the first vinyl group-containing straight-chain organopolysiloxane (A1-1) having an ordinary vinyl group content and the second vinyl group-containing straight-chain organopolysiloxane (A1-2) having a high vinyl group content are combined together as raw rubber that is a raw material of the silicone rubber, it is possible to unevenly distribute vinyl groups and to more effectively form an uneven crosslink density in the crosslink network of the silicone rubber. As a result, it is possible to more effectively increase the tear strength of the silicone rubber.

Specifically, as the vinyl group-containing straight-chain organopolysiloxane (A1), for example, the first vinyl group-containing straight-chain organopolysiloxane (A1-1) having, in the molecule, two or more of a unit in which $R^1$ is a vinyl group and/or a unit in which $R^2$ is a vinyl group in Formula (1-1) in a vinyl group content of equal to or less than 0.4 mol % and the second vinyl group-containing straight-chain organopolysiloxane (A1-2) having the unit in which $R^1$ is a vinyl group and/or the unit in which $R^2$ is a vinyl group in a vinyl group content of 0.5 to 15 mol % of are preferably used.

In addition, the vinyl group content of the first vinyl group-containing straight-chain organopolysiloxane (A1-1) is preferably 0.01 to 0.2 mol % and more preferably 0.02 to 0.15 mol %. In addition, the vinyl group content of the second vinyl group-containing straight-chain organopolysiloxane (A1-2) is preferably 0.5 to 12 mol % and more preferably 0.8 to 8 mol %.

Furthermore, in the case of blending the first vinyl group-containing straight-chain organopolysiloxane (A1-1) and the second vinyl group-containing straight-chain organopolysiloxane (A1-2) in combination, the ratio between (A1-1) and (A1-2) is not particularly limited, but the weight ratio (A1-1):(A1-2) is, for example, preferably 50:50 to 95:5, more preferably 60:40 to 92:8, and still more preferably 80:20 to 90:10.

It should be noted that, for each of the first and second vinyl group-containing straight-chain organopolysiloxane (A1-1) and (A1-2), only one kind of organopolysiloxane may be used or two or more kinds of organopolysiloxanes may be used in combination.

In addition, the vinyl group-containing organopolysiloxane (A) may contain a vinyl group-containing branched organopolysiloxane (A2) having a branched structure.
<<Organohydrogen Polysiloxane (B)>>

The silicone rubber-based curable composition of the present embodiment is capable of containing an organohydrogen polysiloxane (B).

The organohydrogen polysiloxane (B) is classified into a straight-chain organohydrogen polysiloxane (B1) having a straight-chain structure and a branched organohydrogen polysiloxane (B2) having a branched structure, and the silicone rubber-based curable composition is capable of containing any one or both of these organohydrogen polysiloxanes.

The straight-chain organohydrogen polysiloxane (B1) is a polymer that has a straight-chain structure, has a structure in which hydrogen directly bonds to Si (≡Si—H), causes a hydrosilylation reaction with the vinyl groups of the vinyl group-containing organopolysiloxane (A) and a vinyl group that a component that is blended into the silicone rubber-based curable composition has, and crosslinks these components.

The molecular weight of the straight-chain organohydrogen polysiloxane (B1) is not particularly limited; however, for example, the weight-average molecular weight is preferably equal to or less than 20,000 and more preferably equal to or more than 1,000 and equal to or less than 10,000.

It should be noted that the weight-average molecular weight of the straight-chain organohydrogen polysiloxane (B1) can be measured by, for example, polystyrene conversion in gel permeation chromatography (GPC) in which chloroform is used as a developing solvent.

In addition, typically, the straight-chain organohydrogen polysiloxane (B1) preferably has no vinyl group. In such a case, it is possible to accurately prevent the progress of a crosslinking reaction in the molecule of the straight-chain organohydrogen polysiloxane (B1).

As the above-described straight-chain organohydrogen polysiloxane (B1), for example, a straight-chain organohydrogen polysiloxane having a structure represented by Formula (2) is preferably used.

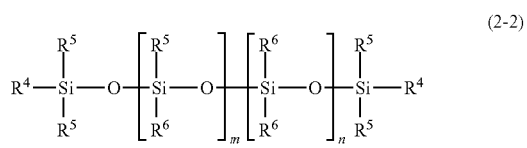

(2-2)

In Formula (2), $R^4$ is a substituted or unsubstituted alkyl group, alkenyl group, or aryl group having 1 to 10 carbon atoms, a hydrocarbon group formed by combining the above-described groups, or a hydride group. As the alkyl group having 1 to 10 carbon atoms, for example, a methyl group, an ethyl group, a propyl group, and the like are exemplified, and, among these, a methyl group is preferred. As the alkenyl group having 1 to 10 carbon atoms, for example, a vinyl group, an allyl group, a butenyl group, and the like are exemplified. As the aryl group having 1 to 10 carbon atoms, for example, a phenyl group is exemplified.

In addition, $R^5$ is a substituted or unsubstituted alkyl group, alkenyl group, or aryl group having 1 to 10 carbon atoms, a hydrocarbon group formed by combining the above-described groups, or a hydride group. As the alkyl group having 1 to 10 carbon atoms, for example, a methyl group, an ethyl group, and a propyl group are exemplified, and, among these, a methyl group is preferred. As the alkenyl group having 1 to 10 carbon atoms, for example, a vinyl group, an allyl group, a butenyl group, and the like are exemplified. As the aryl group having 1 to 10 carbon atoms, for example, a phenyl group is exemplified.

It should be noted that, in Formula (2), a plurality of $R^4$'s is groups independent from each other and may be different from or identical to each other. Furthermore, this is also true for $R^5$'s. However, among the plurality of $R^4$'s and $R^5$'s, at least two are a hydride group.

In addition, $R^6$ is a substituted or unsubstituted alkyl group or aryl group having 1 to 8 carbon atoms or a hydrocarbon group formed by combining the above-described groups. As the alkyl group having 1 to 8 carbon atoms, for example, a methyl group, an ethyl group, a propyl group, and the like are exemplified, and, among these, a methyl group is preferred. As the aryl group having 1 to 8 carbon atoms, for example, a phenyl group is exemplified. A plurality of $R^6$'s is groups independent from each other and may be different from or identical to each other.

It should be noted that, as a substituent in $R^4$, $R^5$, and $R^6$ in Formula (2), for example, a methyl group, a vinyl group, and the like are exemplified, and a methyl group is preferred from the viewpoint of preventing a crosslinking reaction in the molecule.

Furthermore, m and n are the numbers of repeating units that constitute the straight-chain organohydrogen polysiloxane (B1) represented by Formula (2), m is an integer of 2 to 150, and n is an integer of 2 to 150. Preferably, m is an integer of 2 to 100, and n is an integer of 2 to 100.

It should be noted that only one kind of straight-chain organohydrogen polysiloxane (B1) may be used singly or two or more kinds of straight-chain organohydrogen polysiloxanes (B1) may be used in combination.

The branched organohydrogen polysiloxane (B2) has a branched structure and is thus a component that forms a region having a high crosslink density and significantly contributes to the formation of a structure with an uneven crosslink density in a silicone rubber system. In addition, similar to the straight-chain organohydrogen polysiloxane (B1), the branched organohydrogen polysiloxane (B2) is a polymer that has a structure in which hydrogen directly bonds to Si (≡Si—H), causes a hydrosilylation reaction with the vinyl groups of the vinyl group-containing organopolysiloxane (A) and a vinyl group that a component that is blended into the silicone rubber-based curable composition has, and crosslinks these components.

In addition, the specific gravity of the branched organohydrogen polysiloxane (B2) is in a range of 0.9 to 0.95.

Furthermore, typically, the branched organohydrogen polysiloxane (B2) preferably has no vinyl group. In such a case, it is possible to accurately prevent the progress of a crosslinking reaction in the molecule of the branched organohydrogen polysiloxane (B2).

In addition, as the branched organohydrogen polysiloxane (B2), a branched organohydrogen polysiloxane represented by Average Composition Formula (c) is preferred.

$(H_a(R^7)_{3-a}SiO_{1/2})_m(SiO_{4/2})_n$    Average Composition Formula (c)

(In Formula (c), $R^7$ is a monovalent organic group, a is an integer in a range of 1 to 3, m is the number of $H_a(R^7)_{3-a}SiO_{1/2}$ units, and n is the number of $SiO_{4/2}$ units.)

In Formula (c), $R^7$ is a monovalent organic group and preferably a substituted or unsubstituted alkyl group or aryl group having 1 to 10 carbon atoms or a hydrocarbon group formed by combining the above-described groups. As the alkyl group having 1 to 10 carbon atoms, for example, a methyl group, an ethyl group, a propyl group, and the like are exemplified, and, among these, a methyl group is preferred. As the aryl group having 1 to 10 carbon atoms, for example, a phenyl group is exemplified.

In Formula (c), a is the number of hydride groups (hydrogen atoms directly bonding to Si), an integer in a range of 1 to 3, and preferably 1.

In addition, in Formula (c), m is the number of the $H_a(R^7)_{3-a}SiO_{1/2}$ units, and n is the number of the $SiO_{4/2}$ units.

The branched organohydrogen polysiloxane (B2) has a branched structure. The straight-chain organohydrogen polysiloxane (B1) and the branched organohydrogen polysiloxane (B2) are different from each other in terms of the fact that the structure thereof is a straight-chain structure or a branched structure, and the number of alkyl groups R bonding to Si when the number of Si's is set to 1 (R/Si) is 1.8 to 2.1 in the straight-chain organohydrogen polysiloxane (B1) and is in a range of 0.8 to 1.7 in the branched organohydrogen polysiloxane (B2).

It should be noted that, since the branched organohydrogen polysiloxane (B2) has a branched structure, the amount of the residue at the time of heating the branched organohydrogen polysiloxane (B2) up to 1,000° C. in a nitrogen atmosphere at a temperature-rise rate of 10° C./minute reaches equal to or more than 5%. In contrast, since the straight-chain organohydrogen polysiloxane (B1) has a straight-chain shape, the amount of the residue after heating the straight-chain organohydrogen polysiloxane (B1) under the above-described conditions reaches almost zero.

In addition, as specific examples of the branched organohydrogen polysiloxane (B2), organohydrogen polysiloxanes having a structure represented by Formula (3) are exemplified.

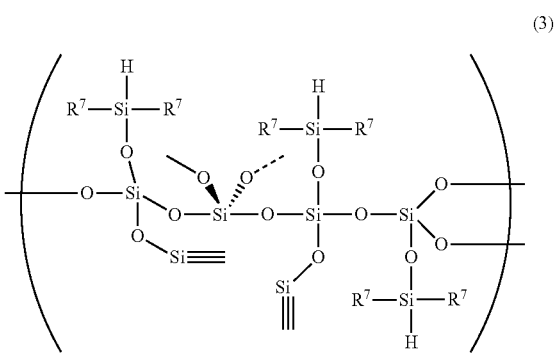

(3)

In Formula (3), $R^7$ is a substituted or unsubstituted alkyl group or aryl group having 1 to 8 carbon atoms, a hydrocarbon group formed by combining the above-described groups, or a hydrogen atom. As the alkyl group having 1 to 8 carbon atoms, for example, a methyl group, an ethyl group, a propyl group, and the like are exemplified, and, among these, a methyl group is preferred. As the aryl group having 1 to 8 carbon atoms, for example, a phenyl group is exemplified. As a substituent in $R^7$, for example, a methyl group and the like are exemplified.

It should be noted that, in Formula (3), a plurality of $R^7$'s is groups independent from each other and may be different from or identical to each other.

In addition, in Formula (3), "—O—Si≡" indicates that Si has a three-dimensionally broadening branched structure.

It should be noted that only one kind of branched organohydrogen polysiloxane (B2) may be used or two or more kinds of branched organopolysiloxanes (B2) may be used in combination.

In addition, in the straight-chain organohydrogen polysiloxane (B1) and the branched organohydrogen polysiloxane (B2), the amounts of the hydrogen atoms directly bonding to Si (hydride groups) are not particularly limited, respectively. However, in the silicone rubber-based curable composition, the total amount of the hydride groups in the straight-chain organohydrogen polysiloxane (B1) and the branched organohydrogen polysiloxane (B2) is preferably 0.5 to 5 mol and more preferably 1 to 3.5 mol with respect to 1 mol of the vinyl groups in the vinyl group-containing straight-chain organopolysiloxane (A1). In such a case, it is possible to reliably form a crosslink network between the straight-chain organohydrogen polysiloxane (B1) and the vinyl group-containing straight-chain organopolysiloxane (A1) and between the branched organohydrogen polysiloxane (B2) and the vinyl group-containing straight-chain organopolysiloxane (A1).

In the present embodiment, the content of the elastomer composition in the insulating paste is preferably equal to or more than 5% by mass, more preferably equal to or more than 8% by mass, and still more preferably equal to or more than 10% by mass with respect to the entire insulating paste. In addition, the content of the elastomer composition in the insulating paste is preferably equal to or less than 50% by mass, more preferably equal to or less than 45% by mass, and still more preferably equal to or less than 40% by mass with respect to the entire insulating paste.

When the content of the elastomer composition is set to equal to or more than the above-described lower limit value, an insulating resin film that is produced using the insulating paste is capable of having appropriate flexibility. In addition, when the content of the elastomer composition is set to equal to or less than the above-described upper limit value, it is possible to improve the mechanical strength of the insulating resin film.

<<Silica Particles (C)>>

The silicone rubber-based curable composition is capable of containing silica particles (C). Therefore, it is possible to improve the hardness or mechanical strength of an insulating resin film that is formed of the insulating paste. In addition, it is possible to enhance the insulating property of the insulating resin film that is produced from the insulating paste.

The silica particles (C) are not particularly limited, and, for example, fumed silica, pyrogenic silica, precipitated silica, and the like are used. These silica particles may be used singly or two or more kinds of silica particles may be used in combination.

The specific surface area of the silica particles (C) measured by, for example, a BET method is, for example, preferably 50 to 400 $m^2/g$ and more preferably 100 to 400 $m^2/g$. In addition, the average primary particle diameter of the silica particles (C) is, for example, preferably 1 to 100 nm and more preferably approximately 5 to 20 nm.

When silica particles having a specific surface area and an average particle diameter in the above-described ranges are used as the silica particles (C), it is possible to improve the hardness or mechanical strength, particularly, tensile strength of silicone rubber to be formed.

In the present embodiment, the content of the silica particles (C) in the insulating paste is preferably equal to or more than 1% by mass, more preferably equal to or more than 3% by mass, and still more preferably equal to or more than 5% by mass with respect to the entire insulating paste. In addition, the content of the silica particles (C) in the insulating paste is preferably equal to or less than 50% by mass, more preferably equal to or less than 45% by mass, and still more preferably equal to or less than 40% by mass with respect to the entire insulating paste.

In addition, the upper limit value of the content of the silica particles (C) that are contained in the insulating resin film for which the insulating paste is used is, for example, preferably equal to or less than 60% by mass, more preferably equal to or less than 50% by mass, and still more preferably equal to or less than 40% by mass with respect to the entire insulating resin film. In addition, the content of the silica particles (C) in the insulating resin film is, for example, preferably equal to or less than 5% by mass, more preferably equal to or less than 10% by mass, and still more preferably equal to or less than 15% by mass with respect to the entire insulating resin film.

When the content of the silica particles (C) is set to equal to or more than the above-described lower limit value, the insulating resin film produced using the insulating paste is capable of having an appropriate mechanical strength. On the other hand, when the content of the silica particles (C) is set to equal to or less than the above-described upper limit value, the insulating resin film is capable of having an appropriate stretch characteristic. Therefore, it is possible to enhance the durability during the repeated use of the insulating resin film.

<<Silane Coupling Agent (D)>>

The silicone rubber-based curable composition of the present embodiment is capable of containing a silane coupling agent (D).

The silane coupling agent (D) is capable of having a hydrolysable group. The hydrolysable group is hydrolyzed by water and turns into a hydroxyl group, and this hydroxyl group causes a dehydration condensation reaction with hydroxyl groups on the surfaces of the silica particles (C), whereby it is possible to modify the surfaces of the silica particles (C).

In addition, this silane coupling agent (D) is capable of containing a silane coupling agent having a hydrophobic group. Therefore, this hydrophobic group is imparted to the surfaces of the silica particles (C), and thus, in the silicone rubber-based curable composition, furthermore, in silicone rubber, the cohesive force of the silica particles (C) weakens (cohesion by a hydrogen bond attributed to a silanol group decreases), and, as a result, it is assumed that the dispersibility of the silica particles in the silicone rubber-based curable composition improves. Therefore, the number of interfaces between the silica particles and the rubber matrix increases, and the reinforcing effect of the silica particles intensifies. Furthermore, it is assumed that, at the time of the matrix deformation of rubber, the sliding property of the silica particles in the matrix improves. In addition, due to the improvement of the dispersibility and the improvement of the sliding property of the silica particles (C), the mechanical strength (for example, tensile strength, tear strength, or the like) of the silicone rubber attributed to the silica particles (C) improves.

Furthermore, the silane coupling agent (D) is capable of containing a silane coupling agent having a vinyl group. Therefore, the vinyl group is introduced to the surfaces of the silica particles (C). Therefore, at the time of the curing of the silicone rubber-based curable composition, that is, when the vinyl groups that the vinyl group-containing organopolysiloxane (A) has and the hydride groups that the organohydrogen polysiloxane (B) has cause a hydrosilylation reaction and thereby form a network (crosslink structure), the vinyl groups that the silica particles (C) have also get involved with a hydrosilylation reaction with the hydride group that the organohydrogen polysiloxane (B) has, and thus the silica particles (C) are also incorporated into the network. Therefore, it is possible to attain a decrease in the hardness and an increase in the modulus of silicone rubber to be formed.

As the silane coupling agent (D), it is possible to jointly use the silane coupling agent having a hydrophobic group and the silane coupling agent having a vinyl group.

As the silane coupling agent (D), for example, a silane coupling agent represented by Formula (4) is exemplified.

$$Y_n\text{---Si---}(X)_{4-n} \qquad (4)$$

In Formula (4), n represents an integer of 1 to 3. Y represents any of functional groups having a hydrophobic group, a hydrophilic group, or a vinyl group. When n is 1, Y is a functional group having a hydrophobic group, and, when n is 2 or 3, at least one Y has a hydrophobic group. X represents a hydrolysable group.

The hydrophobic group is an alkyl group or aryl group having 1 to 6 carbon atoms or a hydrocarbon group formed by combining the above-described groups. Examples thereof include a methyl group, an ethyl group, a propyl group, a phenyl group, and the like, and, among these, a methyl group is particularly preferred.

In addition, as the hydrophilic group, for example, a hydroxyl group, a sulfonic acid group, a carboxyl group, a carbonyl group, and the like are exemplified, and, among these, a hydroxyl group is particularly preferred. It should be noted that the hydrophilic group may be included as a functional group, but is preferably not included since the hydrophilic group imparts hydrophobicity to the silane coupling agent (D).

Furthermore, as the hydrolysable group, an alkoxy group such as a methoxy group or an ethoxy group, a chloro group, a silazane group, and the like are exemplified, and, among these, a silazane group is preferred due to its high reactivity with the silica particles (C). It should be noted that a silane coupling agent having a silazane group as the hydrolysable group have two ($Y_n$—Si—) structures in Formula (4) due to its structural characteristic.

Regarding the specific examples of the silane coupling agent (D) represented by Formula (4), for example, as the silane coupling agent having a hydrophobic group as the functional group, alkoxysilanes such as methyltrimethoxysilane, dimethyldimethoxysilane, phenyltrimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, and decyltrimethoxysilane; chlorosilanes such as methyltrichlorosilane, dimethyldichlorosilane, trimethylchlorosilane, and phenyltrichlorosilane; and hexamethyldisilazane are exemplified, as the silane coupling agent having a vinyl group as the functional group, alkoxysilanes such as methacryloxypropyltriethoxysilane, methacryloxypropyltrimethoxysilane, methacryloxypropylmethyldiethoxysilane, methacryloxypropylmethyldimethoxysilane, vinyltriethoxysilane, vinyltrimethoxysilane, and vinylmethyldimethoxysilane; chlorosilanes such as vinyltrichlorosilane and vinylmethyldichlorosilane; and divinyltetramethyldisilazane are exemplified, and, among these, when the above description is taken into account, particularly, hexamethyldisilazane is preferred as the silane coupling agent having a hydrophobic group, and divinyltetramethyldisilazane is preferred as the silane coupling agent having a vinyl group.

In the present embodiment, the lower limit value of the content of the silane coupling agent (D) is preferably equal to or more than 1% by mass, more preferably equal to or more than 3% by mass, and still more preferably equal to or more than 5% by mass with respect to 100 parts by weight of the total amount of the vinyl group-containing organopolysiloxane (A). In addition, the upper limit value of the content of the silane coupling agent (D) is preferably equal to or less than 100% by mass, more preferably equal to or less than 80% by mass, and still more preferably equal to or less than 40% by mass with respect to 100 parts by weight of the total amount of the vinyl group-containing organopolysiloxane (A).

When the content of the silane coupling agent (D) is set to equal to or more than the lower limit value, the adhesiveness to the insulating resin film produced using the insulating paste becomes appropriate, and, in the case of using the silica particles (C), the silane coupling agent (D) is capable of contributing to the improvement of the mechanical strength of the entire elastomer. In addition, when the content of the silane coupling agent (D) is set to equal to or less than the upper limit value, the insulating resin film is capable of having appropriate mechanical characteristics.

<<Platinum or Platinum Compound (E)>>

The silicone rubber-based curable composition of the present embodiment is capable of containing platinum or a platinum compound (E).

The platinum or platinum compound (E) is a catalytic component that acts as a catalyst at the time of curing. The amount of the platinum or platinum compound (E) added is the amount of a catalyst.

As the platinum or platinum compound (E), it is possible to use well-known platinum or a well-known platinum compound, and examples thereof include platinum black, platinum supported by silica, carbon black, or the like, chloroplatinic acid or an alcohol solution of chloroplatinic acid, a complex salt of chloroplatinic acid and an olefin, a complex salt of chloroplatinic acid and vinylsiloxane, and the like.

It should be noted that only one kind of platinum or platinum compound (E) may be used singly or two or more kinds of platinum or platinum compounds (E) may be used in combination.

In the present embodiment, the content of the platinum or platinum compound (E) in the silicone rubber-based curable composition means the amount of a catalyst, can be appropriately set, and, specifically, is an amount at which the weight of platinum-group metal reaches 0.01 to 1,000 ppm and preferably reaches 0.1 to 500 ppm with respect to 100 parts by weight of the total amount of the vinyl group-containing organopolysiloxane (A), the silica particles (C), and the silane coupling agent (D).

When the content of the platinum or platinum compound (E) is set to equal to or more than the lower limit value, the curing of the silicone rubber-based curable composition in the insulating paste at an appropriate speed becomes possible. In addition, when the content of the platinum or platinum compound (E) is set to equal to or less than the upper limit value, the platinum or platinum compound (E) is capable of contributing to the reduction of the cost for the production of the insulating paste.

<<Water (F)>>

In addition, the silicone rubber-based curable composition of the present embodiment may contain, in addition to the above-described components (A) to (E), water (F).

The water (F) is a component that functions as a dispersion medium that disperses each component contained in the silicone rubber-based curable composition and contributes to the reaction between the silica particles (C) and the silane coupling agent (D). Therefore, it is possible to more reliably link the silica particles (C) and the silane coupling agent (D) in silicone rubber and to exhibit uniform characteristics as a whole.

Furthermore, in the case of containing the water (F), the content of water can be appropriately set and is specifically, for example, preferably in a range of 10 to 100 parts by weight and more preferably in a range of 30 to 70 parts by weight with respect to 100 parts by weight of the silane coupling agent (D). In such a case, it is possible to more reliably progress the reaction between the silane coupling agent (D) and the silica particles (C).

(Other Components)

Furthermore, the silicone rubber-based curable composition of the present embodiment is capable of further containing other components other than the above-described components (A) to (F). As the other components, for example, additives such as an inorganic filler other than the silica particles (C) such as diatomaceous earth, iron oxide, zinc oxide, titanium oxide, barium oxide, magnesium oxide, cerium oxide, calcium carbonate, magnesium carbonate, zinc carbonate, glass wool, or mica, a reaction inhibitor, a dispersant, a pigment, a dye, an antistatic agent, an antioxidant, a flame retardant, and a thermal conductivity improver are exemplified.

<<Organic Peroxide (H)>>

The silicone rubber-based curable composition of the present embodiment is capable of containing an organic peroxide (H). The organic peroxide (H) is a component that acts as a catalyst. The organic peroxide (H) can be used in place of the organohydrogen polysiloxane (B) and the platinum or platinum compound (E) or can be used jointly with the organohydrogen polysiloxane (B) and the platinum or platinum compound (E).

As the organic peroxide (H), for example, ketone peroxides, diacyl peroxides, hydroperoxides, dialkyl peroxides, peroxyketals, alkyl peresters, peroxyesters and peroxydioxides are exemplified, and, specifically, for example, benzoyl peroxide, 2,4-dichlorobenzoyl peroxide, p-methylbenzoyl peroxide, o-methylbenzoyl peroxide, dicumyl peroxide, 2,5-dimethyl-bis(2,5-t-butylperoxy) hexane, di-t-butylperoxide, t-butylperbenzoate, 1,6-hexanediol-bis-t-butylperoxycarbonate, and the like are exemplified.

(Solvent)

The insulating paste of the present embodiment contains a solvent. As this solvent, it is possible to use a variety of well-known solvents, and, for example, a high-boiling point solvent can be contained. These solvents may be used singly or two or more kinds of solvents may be used in combination.

The lower limit value of the boiling point of the high-boiling point solvent is, for example, equal to or higher than 100° C., preferably equal to or higher than 130° C., and more preferably equal to or higher than 150° C. In such a case, it is possible to improve the film-forming property of a coating film to be obtained or to suppress a film thickness variation in the coating film at the time of applying the insulating paste onto a supporting substrate. On the other hand, the upper limit value of the boiling point of the high-boiling point solvent is not particularly limited and may be, for example, equal to or lower than 300° C., equal to or lower than 290° C., or equal to or lower than 280° C. In such a case, since it is possible to suppress an excessive heat history at the time of forming wires, it is possible to suppress damage to electronic components or wires. In addition, since it is possible to use, as a substrate, an elastomer of the insulating paste from which the solvent has been sufficiently volatilized, it is possible to favorably maintain the shape of a wire formed using the insulating paste on the surface of such a substrate by printing.

In addition, the solvent of the present embodiment can be appropriately selected from the viewpoint of the solubility and boiling point of the elastomer and is capable of containing, for example, an aliphatic hydrocarbon having 5 to 20 carbon atoms, preferably an aliphatic hydrocarbon having 8 to 18 carbon atoms, and more preferably an aliphatic hydrocarbon having 10 to 15 carbon atoms.

In addition, as examples of the solvent of the present embodiment, for example, aliphatic hydrocarbons such as pentane, hexane, cyclohexane, heptane, methylcyclohexane, ethylcyclohexane, octane, decane, dodecane, and tetradecane; aromatic hydrocarbons such as benzene, toluene, ethylbenzene, xylene, mesitylene, trifluoromethylbenzene, and benzotrifluoride; ethers such as diethyl ether, diisopropyl ether, dibutyl ether, cyclopentyl methyl ether, cyclopentyl ethyl ether, ethylene glycol dimethyl ether, ethylene glycol diethyl ether, diethylene glycol dimethyl ether, diethylene glycol monobutyl ether, dipropylene glycol dimethyl ether, dipropylene glycol methyl-n-propyl ether, 1,4-dioxane, 1,3-dioxane, and tetrahydrofuran; haloalkanes such as dichloromethane, chloroform, 1,1-dichloroethane, 1,2-dichloroethane, 1,1,1-trichloroethane, and 1,1,2-trichloroethane; carboxylic acid amides such as N, N-dimethylformamide and N, N-dimethylacetamide; sulfoxides such as dimethyl sulfoxide and diethyl sulfoxide; and esters such as diethyl carbonate can be exemplified. These solvents may be used singly or two or more kinds of solvents may be used in combination.

The solvent used here may be appropriately selected from solvents capable of uniformly dissolving or dispersing the composition components in the insulating paste.

The solvent is capable of containing a first solvent in which the upper limit value of the polarity term ($\delta_p$) of a Hansen solubility parameter is, for example, equal to or less than 10 $MPa^{1/2}$, preferably equal to or less than 7 $MPa^{1/2}$, and more preferably equal to or less than 5.5 $MPa^{1/2}$. In such a case, it is possible to improve the dispersibility or solubility of the elastomer composition such as the silicone rubber-based curable resin composition in the insulating paste. The lower limit value of the polarity term (dp) of the first solvent is not particularly limited and may be, for example, equal to or more than 0 $Pa^{1/2}$.

The upper limit value of the hydrogen bond term (oh) of the Hansen solubility parameter in the first solvent is, for example, equal to or less than 20 $MPa^{1/2}$, preferably equal to or less than 10 $MPa^{1/2}$, and more preferably equal to or less than 7 $MPa^{1/2}$. In such a case, it possible to improve the dispersibility and solubility of the elastomer composition such as the silicone rubber-based curable resin composition in the insulating paste. The lower limit value of the hydrogen bond term ($\delta_h$) of the first solvent is not particularly limited and may be, for example, equal to or more than 0 $Pa^{1/2}$.

The Hansen solubility parameter (HSP) is an index that represents solubility, which indicates how much a certain substance dissolves in another substance. HSP represents solubility as a three-dimensional vector. This three-dimensional vector can be typically represented by a dispersion term ($\delta_d$), a polarity term ($\delta_p$), and a hydrogen bond term ($\delta_h$). In addition, substances having similar vectors can be determined to be highly soluble in each other. The similarity between vectors can be determined by the distance between the Hansen solubility parameters (HSP distance).

The Hansen solubility parameters (HSP values) that are used in the present specification can be computed using software called HSPiP (Hansen Solubility Parameters in Practice). Here, the computer software HSPiP developed by Hansen and Abbott includes a function of computing the HSP distance and a database of the Hansen parameters of a variety of resins, solvents, and non-solvents.

For each resin, the solubility in a pure solvent and the solubility in a solvent mixture of a good solvent and a poor solvent are investigated, the results are input to the HSPiP software, and D: dispersion term, P: polarity term, H: hydrogen bond term, and R0: solubility sphere radius are computed.

As the solvent of the present embodiment, for example, a solvent having a small difference in the HSP distance and the polarity term or the hydrogen bond term from the elastomer or the constitution unit that constitutes the elastomer can be selected.

The lower limit value of the viscosity of the insulating paste measured at room temperature (25° C.) and a shear rate of 20 [1/s] is, for example, equal to or more than 1 Pa·s, preferably equal to or more than 5 Pa·s, and more preferably equal to or more than 10 Pa·s. In such a case, it is possible to improve the film-forming property. In addition, it is also possible to suppress a film thickness variation during the formation of a thick film. On the other hand, the upper limit value of the viscosity of the insulating paste at room temperature (25° C.) is, for example, equal to or less than 100 Pa·s, preferably equal to or less than 90 Pa·s, and more preferably equal to or less than 80 Pa·s. In such a case, it is possible to improve the easiness in applying the insulating paste.

In the insulating paste in the present embodiment, the viscosity measured at room temperature (25° C.) and a shear rate of 1 [1/s] is represented by η1, the viscosity measured at room temperature (25° C.) and a shear rate of 5 [1/s] is represented by η5, and the viscosity ratio (η1/η5) is regarded as the thixotropy index. At this time, the lower limit value of the thixotropy index is, for example, equal to or more than 1.0, preferably equal to or more than 1.1, and more preferably equal to or more than 1.2. In such a case, the application operation of the insulating paste with a squeegee or the like becomes easy. On the other hand, the upper limit value of the thixotropy index is, for example, equal to or less than 3.0, preferably equal to or less than 2.5, and more preferably equal to or less than 2.0. In such a case, it is possible to enhance the leveling property of the insulating paste.

The upper limit value of the durometer hardness A, which is specified in accordance with JIS K6253 (1997), of an insulating resin film that is produced using the insulating paste of the present embodiment (for example, a cured substance of the insulating paste) may be, for example, equal to or less than 70, preferably equal to or less than 68, and more preferably equal to or less than 65. In such a case, in the insulating resin film, it is possible to improve the flexibility, and deformation such as bending and stretching becomes easy. The lower limit value of the durometer hardness A of the insulating resin film is, for example, equal to or more than 10, preferably equal to and more than 20, and more preferably equal to or more than 30. When such an insulating resin film is used as a base substrate, it is possible to enhance the property of forming wires on the surface of the base substrate. For example, it is possible to suppress a variation in shape or height among wires formed by printing such as screen printing.

The lower limit value of the tensile strength, which is measured in accordance with JIS K6251 (2004), of an insulating resin film that is produced using the insulating paste of the present embodiment (for example, a cured substance of the insulating paste) is, for example, equal to or more than 5.0 MPa, preferably equal to or more than 6.0 MPa, and more preferably equal to or more than 7.0 MPa. In such a case, it is possible to improve the mechanical strength of the insulating resin film. In addition, it is possible to increase the breaking energy. Therefore, it is possible to realize an insulating resin film having durability excellent enough to withstand repeated deformation. On the other hand, the upper limit value of the tensile strength of the insulating resin film is not particularly limited and may be, for example, equal to or less than 15 MPa or equal to or less than 13 MPa. Therefore, it is possible to achieve the balance between the stretchability and the mechanical strength of the insulating resin film.

The lower limit value of the tear strength, which is measured in accordance with JIS K6252 (2001), of an insulating resin film that is produced using the insulating paste of the present embodiment (for example, a cured substance of the insulating paste) is, for example, equal to or more than 25 N/mm, preferably equal to or more than 30 N/mm, more preferably equal to or more than 33 N/mm, and still more preferably equal to or more than 35 N/mm. In such a case, it is possible to improve the durability or mechanical strength of the insulating resin film during repeated use. On the other hand, the upper limit value of the tear strength of the insulating resin film is not particularly limited and may be, for example, set to equal to or less than 70 N/mm or set to equal to or less than 60 N/mm. In such a case, it is possible to achieve the balance among a variety of characteristics of the insulating resin film of the present embodiment.

In the present embodiment, it is possible to control the viscosity, the thixotropy index, the hardness, the tensile strength, and the tear strength by appropriately selecting, for example, the kind or blending amount of each component that is contained in the insulating paste, the preparation method of the insulating paste, and the like. Among these, for example, the appropriate selection of the kind of the solvent such as a hydrophobic solvent, a hydrocarbon-based solvent, a high-boiling point solvent suitable for printing, or a solvent having a small polarity term or a small hydrogen bond term, the control of the uneven distribution of the crosslink density or crosslink structure of a resin by the blending amount or blending ratio of the silica particles (C) or the use of the vinyl group-containing organopolysiloxane (A) having a vinyl group at the terminal, the surface modification of the silica particles (C) with the silane coupling agent (D), and a more reliable progress of the reaction between the silane coupling agent (D) and the silica particles (C) by the addition of water or the like are exemplified as elements for setting the viscosity, the thixotropy index, the hardness, the tensile strength, and the tear strength in desired numerical ranges.

(Manufacturing Method of Insulating Paste)

Hereinafter, a manufacturing method of the insulating paste according to the present embodiment will be described.

The insulating paste of the present embodiment can be manufactured by, for example, carrying out steps as described below.

First, the individual components of the silicone rubber-based curable composition are uniformly mixed together with an arbitrary kneading device, thereby preparing a silicone rubber-based curable composition.

[1] For example, predetermined amounts of the vinyl group-containing organopolysiloxane (A), the silica particles (C), and the silane coupling agent (D) are weighed and then kneaded with an arbitrary kneading device, thereby obtaining a kneaded substance containing the respective components (A), (C), and (D).

It should be noted that this kneaded substance is preferably obtained by kneading the vinyl group-containing organopolysiloxane (A) and the silane coupling agent (D) in advance and then kneading (mixing) the silica particles (C). In such a case, the dispersibility of the silica particles (C) in the vinyl group-containing organopolysiloxane (A) further improves.

In addition, at the time of obtaining this kneaded substance, the water (F) may be added to the kneaded substance of the respective components (A), (C), and (D) as necessary. In such a case, it is possible to more reliably progress the reaction between the silane coupling agent (D) and the silica particles (C).

Furthermore, the respective components (A), (C), and (D) are preferably kneaded by carrying out a first step of heating the components at a first temperature and a second step of heating the components at a second temperature. In such a case, it is possible to treat the surfaces of the silica particles (C) with the coupling agent (D) in the first step and to reliably remove a by-product generated from the reaction between the silica particles (C) and the coupling agent (D) from the kneaded substance in the second step. After that, as necessary, the component (A) may be added to the obtained kneaded substance and further kneaded. Therefore, it is possible to improve the familiarity between the components of the kneaded substance.

The first temperature is preferably, for example, approximately 40° C. to 120° C. and more preferably, for example, approximately 60° C. to 90° C. The second temperature is preferably, for example, approximately 130° C. to 210° C. and more preferably, for example, approximately 160° C. to 180° C.

In addition, the atmosphere in the first step is preferably an inert atmosphere such as a nitrogen atmosphere, and the atmosphere in the second step is preferably a reduced-pressure atmosphere.

Furthermore, the time of the first step is, for example, preferably approximately 0.3 to 1.5 hours and more preferably approximately 0.5 to 1.2 hours. The time of the second step is, for example, preferably approximately 0.7 to 3.0 hours and more preferably approximately 1.0 to 2.0 hours.

When the first step and the second step are carried out under the above-described conditions, it is possible to more significantly obtain the above-described effect.

[2] Next, predetermined amounts of the organohydrogen polysiloxane (B) and the platinum or platinum compound (E) are weighed, and then the respective components (B) and (E) are kneaded into the kneaded substance prepared in the step [1] using an arbitrary kneading device, thereby obtaining a silicone rubber-based curable composition (elastomer composition).

It should be noted that, at the time of kneading the respective components (B) and (E), it is preferable to knead the kneaded substance prepared in the step [1] and the organohydrogen polysiloxane (B), knead the kneaded substance prepared in the step [1] and the platinum or platinum compound (E) in advance, and then knead the respective kneaded substances. In such a case, it is possible to reliably disperse the respective components (A) to (E) in the silicone rubber-based curable composition without progressing the reaction between the vinyl group-containing organopolysiloxane (A) and the organohydrogen polysiloxane (B).

Regarding the temperature at the time of kneading the respective components (B) and (E), the temperature set in the roll is, for example, preferably approximately 10° C. to 70° C. and more preferably approximately 25° C. to 30° C.

Furthermore, the kneading time is, for example, preferably approximately five minutes to one hour and more preferably approximately 10 minutes to 40 minutes.

In the step [1] and the step [2], when the temperature is set in the above-described range, it is possible to more accurately prevent or suppress the progress of the reaction between the vinyl group-containing organopolysiloxane (A) and the organohydrogen polysiloxane (B). In addition, in the step [1] and the step [2], when the kneading time is set in the above-described range, it is possible to more reliably disperse the respective components (A) to (E) in the silicone rubber-based curable composition.

It should be noted that the kneading device that is used in the respective steps [1] and [2] is not particularly limited, and it is possible to use, for example, a kneader, a twin-roll, a Banbury mixer (continuous kneader), a pressure kneader, or the like.

In addition, in the present step [2], a reaction inhibitor such as 1-ethynylcyclohexanol may be added to the kneaded substance. In such a case, even when the temperature of the kneaded substance is set to a relatively high temperature, it is possible to more accurately prevent or suppress the progress of the reaction between the vinyl group-containing organopolysiloxane (A) and the organohydrogen polysiloxane (B).

In addition, in the present step [2], the organic peroxide (H) may be added in place of the organohydrogen polysiloxane (B) and the platinum or platinum compound (E) or together with the organohydrogen polysiloxane (B) and the platinum or platinum compound (E). Preferred conditions such as the temperature and the time at the time of kneading the organic peroxide (H) and a device to be used are the same as the conditions at the time of kneading the organohydrogenpolysiloxane (B) and the platinum or platinum compound (E).

[3] Next, the elastomer composition (silicone rubber-based curable composition) obtained in the step [2] is dissolved in a solvent, whereby the insulating paste of the present embodiment can be obtained.

[Use]

Hereinafter, an example of the use of the insulating paste of the present embodiment will be described with reference to FIG. 1. FIG. 1 schematically shows an electronic device 100 including a wire as a cross-sectional view.

The electronic device 100 is capable of including a wiring substrate 50 and an electronic component 60 as shown in FIG. 1. The wiring substrate 50 is constituted by providing a wire 10 on a substrate 20. As the substrate 20, a stretchable insulating substrate can be used. The substrate 20 can be made of a cured substance obtained by curing the insulating paste of the present embodiment. The electronic component 60 may be constituted so as to be electrically connected to the wire 10 that constitutes such a stretchable wiring substrate (wiring substrate 50).

Since the insulating paste of the present embodiment is capable of maintaining the mechanical strength in a cured substance to be obtained or the durability when repeatedly stretched, it is possible to realize the structure of the electronic device 100 having excellent connection reliability.

The electronic device 100 of the present embodiment can be used as, for example, a wearable device and can be preferably used for devices that are repeatedly stretched in all directions.

In addition, the wire 10 that constitutes the electronic device 100 of the present embodiment is typically made of a flexible conductive material. The conductive material is capable of containing, for example, an elastomer composition and a conductive filler.

As the elastomer composition, the same elastomer composition as the elastomer composition exemplified as the material of the above-described insulating paste can be adopted. Specifically, it is possible to use elastomer compositions that are used to form silicone rubber, urethane rubber, fluorine rubber, nitrile rubber, acrylic rubber, styrene rubber, chloroprene rubber, ethylene propylene rubber, and the like, and these materials can be appropriately selected according to the use or the like.

The wire 10 may be made of a cured substance of a conductive paste containing the silicone rubber-based curable composition and a conductive filler.

As the conductive filler in the conductive paste, for example, a well-known conductive material may be used, and metallic powder (G) as described below can be contained.

Metal that constitutes the metallic powder (G) is not particularly limited, and, for example, at least one kind of copper, silver, gold, nickel, tin, lead, zinc, bismuth, antimony, or metallic powder formed by alloying the above-described metals or two or more kinds thereof can be contained.

Among these, as the metallic powder (G), silver or copper, that is, silver powder or copper powder is preferably contained due to its high conductive property or high easiness of procurement. It should be noted that the metallic powder (G) can also be used after being coated with a different kind of metal.

In the present embodiment, the shape of the metallic powder (G) is not limited, and it is possible to use metallic powder having a dendrite shape, a spherical shape, a scale shape, or the like that has been thus far used in the related art. Among these, the scale shape is preferred.

In addition, the particle diameter of the metallic powder (G) is also not limited, but the average particle diameter $D_{50}$ is, for example, preferably equal to or more than 0.001 μm, more preferably equal to or more than 0.01 μm, and still more preferably equal to or more than 0.1 μm. Regarding the particle diameter of the metallic powder (G), the average particle diameter $D_{50}$ is, for example, preferably equal to or less than 1,000 μm, more preferably equal to or less than 100 μm, and still more preferably equal to or less than 20 μm.

When the average particle diameter $D_{50}$ is set in such a range, the cured substance of the conductive paste is capable of exhibiting an appropriate conductive property. It should be noted that the particle diameter of the metallic powder (G) can be defined as, for example, the average value of the particle diameters of 200 arbitrarily selected metallic powders that are measured by observing the conductive paste or the cured substance of the conductive paste with a transmission electron microscope or the like and carrying out an image analysis.

The content of the conductive filler in the conductive paste is preferably equal to or more than 30% by mass, more preferably equal to or more than 40% by mass, and still more preferably equal to or more than 50% by mass with respect to the entire conductive paste. In addition, the content of the conductive filler in the conductive paste is preferably equal to or less than 85% by mass, more preferably equal to or less than 75% by mass, and still more preferably equal to or less than 65% by mass with respect to the entire conductive paste.

In addition, the lower limit value of the content of the conductive filler that the cured substance of the conductive paste contains is preferably equal to or more than 30% by mass, more preferably equal to or more than 40% by mass, and still more preferably equal to or more than 50% by mass with respect to the entire cured substance of the conductive paste. In addition, the upper limit value of the content of the conductive filler that the cured substance of the conductive paste contains is, for example, preferably equal to or less than 95% by mass or equal to or less than 90% by mass, more preferably equal to or less than 87% by mass, and still more preferably equal to or less than 85% by mass with respect to the entire cured substance of the conductive paste.

When the content of the conductive filler is set to equal to or more than the lower limit value, the cured substance of the conductive paste is capable of having an appropriate conductive characteristic. In addition, when the content of the conductive filler is set to equal to or less than the upper limit value, the cured substance is capable of having appropriate flexibility.

In addition, the lower limit value of the content of the silica particles (C) that the cured substance of the conductive paste contains can be set to, for example, equal to or more than 1% by mass, preferably equal to or more than 3% by mass, and more preferably equal to or more than 5% by mass with respect to 100% by mass of the total amount of the silica particles (C) and the conductive filler. In such a case, it is possible to improve the mechanical strength of the cured substance of the conductive paste. On the other hand, the upper limit value of the content of the silica particles (C) that the cured substance of the conductive paste contains can be set to, for example, equal to or less than 20% by mass, preferably equal to or less than 15% by mass, and more preferably equal to or less than 10% by mass with respect to 100% by mass of the total amount of the silica particles (C) and the conductive filler. In such a case, it is possible to achieve the balance between the stretch electric characteristic and the mechanical strength in the cured substance of the conductive paste.

In the present embodiment, as a solvent for the conductive paste, it is possible to use the above-described kinds of solvents, and, among them, a solvent capable of dissolving the insulating paste or an insulating sheet that is a cured substance of the insulating paste can be used. As a specific solvent for the conductive paste, for example, a high-boiling point solvent or a solvent having a polarity term $(\delta_p)$ or hydrogen bond term (on) of HSP that is equal to or less than the above-described upper limit value can be used.

The insulating paste of the present embodiment can be used for a substrate that constitutes a stretchable substrate including stretchable wires formed of the cured substance of the conductive paste as described above or for an interlayer insulating layer between these wires.

In addition, the electronic component 60 may be appropriately selected from well-known components according to the use. Specifically, a semiconductor element, a resistance or a capacitor other than the semiconductor element, and the like can be exemplified. As the semiconductor element, for example, a transistor, a diode, an LED, a capacitor, and the like can be exemplified. In the electronic device 100 of the present embodiment, the electronic component 60 is electrically connected with the wire 10.

In addition, the electronic device 100 of the present embodiment may be provided with a cover material 30 as necessary. Due to the cover material 30 provided, it is possible to prevent damage to the wire 10 and the electronic component 60. The cover material 30 may be constituted so as to cover the electronic component 60 or the wire 10 on the substrate 20.

In addition, the cover material 30 can be made of the same material as the substrate 20. Since such a cover material 30 follows the stretching of the substrate 20 or the wire 10, it is possible to evenly stretch the electronic device 100 as a whole and also to contribute to the expansion of the service life of the electronic device 100.

Next, an example of manufacturing steps of the electronic device 100 of the present embodiment will be described using FIG. 2A to FIG. 2F.

FIG. 2A to FIG. 2F are cross-sectional views showing the outline of the manufacturing steps of the electronic device 100 in the present embodiment.

Figure 2A:
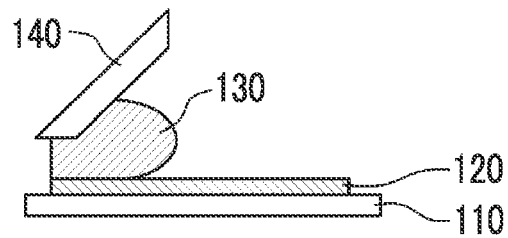
FIG. 2 is a cross-sectional view schematically showing manufacturing steps of the electronic device in the present embodiment.

First, as shown in FIG. 2A, a support 120 is installed on a work table 110, and an insulating paste 130 is applied onto the support 120. As an application method, a variety of methods can be used, and, for example, a printing method such as a squeegee method in which a squeegee 140 is used can be used. Subsequently, the coating film-like insulating paste 130 is dried, whereby an insulating layer 132 (dried insulating sheet) can be formed on the support 120. The drying conditions can be appropriately set according to the kind and amount of a solvent in the insulating paste 130, and, for example, it is possible to set the drying temperature to 150° C. to 180° C., the drying time to 1 minute to 30 minutes, and the like.

Figure 2B:
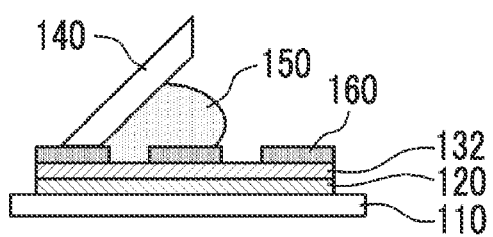
Figure 2C:
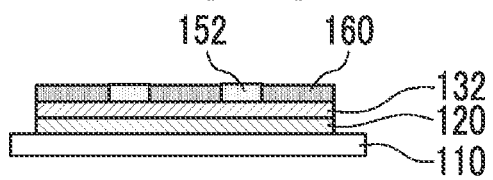
Figure 2D:
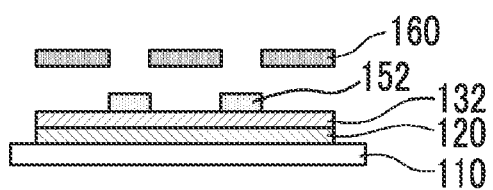

Subsequently, as shown in FIG. 2B, a mask 160 having a predetermined opening pattern is disposed on the insulating layer 132. In addition, as shown in FIG. 2B and FIG. 2C, a conductive paste 150 is applied onto the insulating layer 132 through the mask 160. As an application method, the same method as the application method of the insulating paste 130 can be used, and, for example, squeegee printing using the squeegee 140 may also be used. Here, in a case where the insulating paste 130 and the conductive paste 150 each contain a thermosetting elastomer composition, the pastes may be collectively subjected to a curing treatment after a conductive coating film (conductive layer 152) having a predetermined pattern shape is laminated on the dried insulating layer 132. The curing treatment can be appropriately set according to the thermosetting elastomer composition, and, for example, it is possible to set the curing temperature to 160° C. to 220° C., the curing time to one hour to three hours, and the like. After the curing treatment or before the curing treatment, the mask 160 can be removed as shown in FIG. 2D. Therefore, it is possible to form a wire that is a cured substance of the conductive layer 152 having a predetermined pattern shape on the substrate made of a cured substance of the insulating layer 132.

Figure 2E:
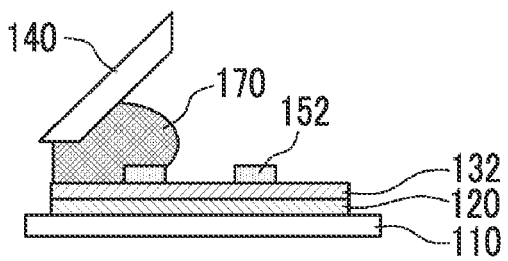
Figure 2F:
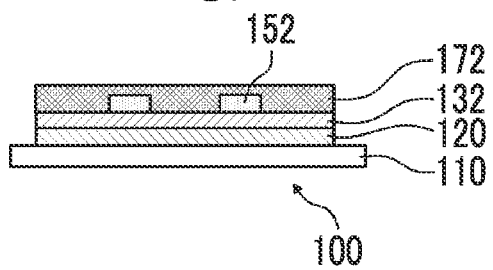

Subsequently, as shown in FIG. 2E, an insulating paste 170 is further applied onto the insulating layer 132 and the patterned conductive layer 152, and, as shown in FIG. 2F, an insulating layer 172 can be formed. These steps may be appropriately repeated. In addition, it is also possible to separate the support 120 from the insulating layer 132.

With the above-described steps, the electronic device 100 shown in FIG. 2F can be obtained.

It should be noted that, in the case of using an insulating sheet in place of the insulating paste, the process may start from the step shown in FIG. 2B. That is, the conductive paste 150 may be applied onto the insulating sheet through the mask 160 after the insulating sheet is installed on the support 120 and dried in a predetermined manner. The subsequent steps can be carried out according to the above-described steps. Therefore, the electronic device 100 shown in FIG. 2F can be obtained.

It should be noted that the present invention is not limited to the above-described embodiment, and modifications, improvements, and the like are included in the present invention as long as the object of the present invention can be achieved.

EXAMPLES

Hereinafter, the present invention will be described using examples and comparative examples, but the present invention is not limited thereto.

Materials used in the examples and the comparative examples are as described below.
(Vinyl Group-Containing Organopolysiloxane (A))
 (A1-1): First vinyl group-containing straight-chain organopolysiloxane: the vinyl group content was 0.13 mol %, Mn was 227, 734, Mw was 573, 903, the IV value (dl/g) was 0.89), and a vinyl group-containing dimethylpolysiloxane synthesized according to the following synthesis scheme 1 (structure represented by Formula (1-1))
 (A1-2): Second vinyl group-containing straight-chain organopolysiloxane: the vinyl group content was 0.92 mol %, and a vinyl group-containing dimethylpolysiloxane synthesized according to the following synthesis scheme 2 (structure represented by Formula (1-1) in which $R^1$ and $R^2$ were each a vinyl group)

(Organohydrogen polysiloxane (B))
 (B1): Organohydrogen polysiloxane: manufactured by Momentive, "88466"

(Silica Particles (C))
 (C1): Silica particles (particle diameter: 7 nm, specific surface area: 300 m²/g), manufactured by Nippon Aerosil Co., Ltd. "AEROSIL300"

(Silane Coupling Agent (D))
 (D1): Hexamethyldisilazane (HMDZ), manufactured by Gelest, Inc., "HEXAMETHYLDISILAZANE (SIH6110.1)"

(Platinum or Platinum Compound (E))
 (E1): Platinum compound, PLATINUM DIVINYLTETRAMETHYLDISILOXANE COMPLEX (in xylene), (manufactured by Gelest, Inc., trade name "SIP6831.2")

(Water (F))
 (F1): Pure water (Additive)
 (Reaction inhibitor 1): 1-Ethynyl-1-cyclohexanol (manufactured by Tokyo Chemical Industry Co., Ltd.)

(Synthesis of vinyl Group-Containing organopolysiloxane (A))

[Synthesis Scheme 1: Synthesis of First vinyl Group-Containing Straight-Chain organopolysiloxane (A1-1)]

The first vinyl group-containing straight-chain organopolysiloxane (A1-1) was synthesized according to Formula (5).

That is, octamethylcyclotetrasiloxane (74.7 g, 252 mmol) and potassium siliconate (0.1 g) were fed into a 300 mL Ar gas-substituted separable flask having a cooling pipe and a stirring blade, heated, and stirred at 120° C. for 30 minutes. It should be noted that, at this time, it was possible to confirm an increase in the viscosity.

After that, the components were heated up to 155° C. and continuously stirred for three hours. In addition, after three hours, 1,3-divinyltetramethyldisiloxane (0.1 g, 0.6 mmol) was added thereto, and, furthermore, the components were stirred at 155° C. for four hours.

Furthermore, after four hours, the components were diluted with toluene (250 mL) and then cleaned with water three times. An organic layer after cleaning was re-precipitated and purified by being cleaned with methanol (1.5 L) several times, and an oligomer and a polymer were separated from each other. The obtained polymer was dried at reduced pressure for one night at 60° C., thereby obtaining a first vinyl group-containing straight-chain organopolysiloxane (A1-1) (Mw=573, 903, Mn=227, 734). In addition, the vinyl group content computed by an H-NMR spectrum measurement was 0.13 mol %.

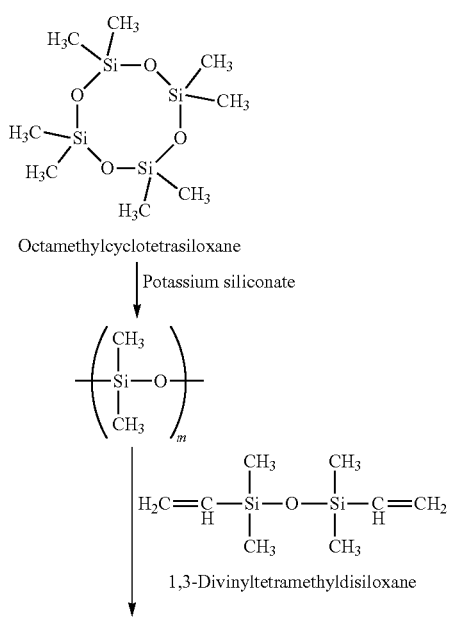

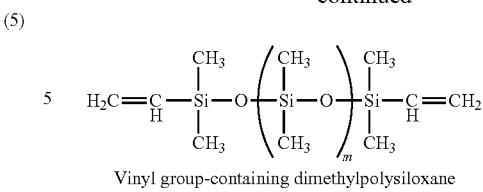

Vinyl group-containing dimethylpolysiloxane

[Synthesis Scheme 2: Synthesis of Second vinyl Group-Containing Straight-Chain organopolysiloxane (A1-2)]

The second vinyl group-containing straight-chain organopolysiloxane (A1-2) was synthesized as shown in Formula (6) in the same manner as the synthesis steps of (A1-1) except the fact that, in the synthesis steps of (A1-1), in addition to octamethylcyclotetrasiloxane (74.7 g, 252 mmol), 2,4,6,8-tetramethyl 2,4,6,8-tetravinylcyclotetrasiloxane (0.86 g, 2.5 mmol) was used. In addition, the vinyl group content computed by an H-NMR spectrum measurement was 0.92 mol %.

(6)

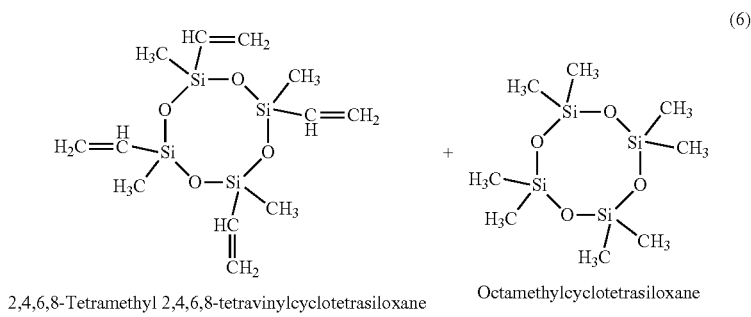

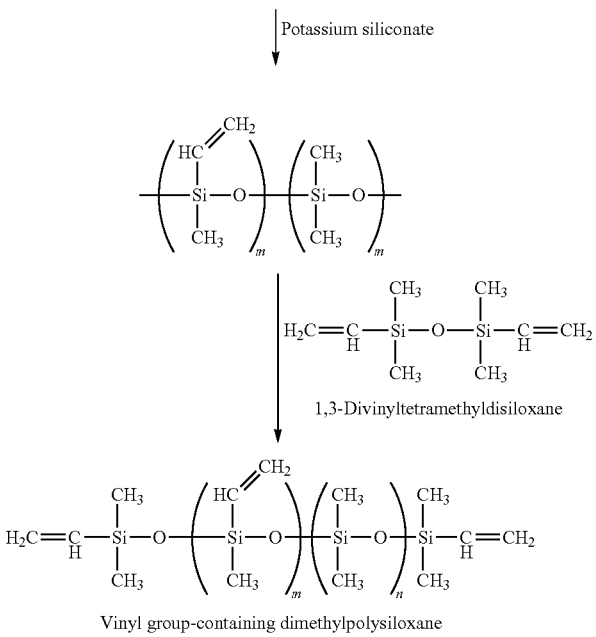

Vinyl group-containing dimethylpolysiloxane

[Production of Insulating Paste]
(Preparation of Silicone Rubber-Based Curable Compositions 1 to 3)

Silicone rubber-based curable compositions 1 to 3 were adjusted as described below. First, a mixture of the vinyl group-containing organopolysiloxane (A), which accounted for 90%, the silane coupling agent (D), and the water (F), was kneaded in advance at the proportions shown in Table 1, then, the silica particles (C) were added to the mixture, and the components were further kneaded, thereby obtaining a kneaded substance (silicone rubber compound).

Here, the kneading after the addition of the silica particles (C) is carried out by a first step of kneading the components for one hour under conditions of 60° C. to 90° C. in a nitrogen atmosphere for a coupling reaction and a second step of kneading the components for two hours under conditions of 160° C. to 180° C. in a reduced-pressure atmosphere for the removal of a by-product (ammonia). After that, the kneaded substance was cooled, the vinyl group-containing organopolysiloxane (A), which accounted for the remaining 10%, was added thereto in two parts, and the components were kneaded for 20 minutes.

Subsequently, the organohydrogen polysiloxane (B), the platinum or platinum compound (E), and the reaction inhibitor were added to the obtained kneaded substance (silicone rubber compound) (100 parts by weight) at the proportions shown in Table 1 and kneaded with a roll, thereby obtaining silicone rubber-based curable compositions 1 to 3 (elastomer compositions 1 to 3).

TABLE 1

| | | | | Unit | 1 | 2 | 3 |
|---|---|---|---|---|---|---|---|
| Silicon rubber-based curable composition | Silicon rubber compound (kneaded substance) | Vinyl group-containing organopolysiloxane (A) | (A1-1) | Parts by weight | 58.7 | 46.7 | 79.2 |
| | | | (A1-2) | | 15 | 11.9 | 20.2 |
| | | Silica particles (C) | (C1) | | 18.4 | 29.3 | 0 |
| | | Silane coupling agent (D) | (D1) | | 4.8 | 7.6 | 0 |
| | | Water (F) | (F1) | | 2.6 | 4.1 | 0 |
| | Catalyst | Platinum or platinum compound (E) | (E1) | Parts by weight (with respect to 100 parts by weight of kneaded substance) | 0.03 | 0.03 | 0.04 |
| | Crosslinking agent | Organohydrogen polysiloxane (B) | (B1) | | 0.40 | 0.30 | 0.46 |
| | Additive | Reaction inhibitor | Reaction inhibitor 1 | | 0.07 | 0.07 | 0.1 |

(Elastomer Composition 4)

As an elastomer composition 4, "C6-135 ELASTOMER (containing silica particles)" manufactured by Dow Corning Toray Co., Ltd. was used.

(Elastomer Composition 5)

Urethane diacrylate (manufactured by Toagosei Co., Ltd., trade name "ARONIX M-1200") (9.2 g), silica particles (manufactured by Aerosil Co., Ltd. "AEROSIL300") (3.5 g) that were surface-treated with a silane coupling agent (hexamethyldisilazane (manufactured by Gelest, Inc.) (0.9 g), and an organic peroxide initiator (manufactured by NOF Corporation, trade name "PERHEXA 3M") (0.1 g) were mixed together, thereby obtaining an elastomer composition 5.

Example 1: Insulating Paste 1

The obtained silicone rubber-based curable composition 1 (elastomer composition 1) (32 parts by weight) was immersed in tetradecane (68 parts by weight) and, subsequently, stirred with a planetary mixer, thereby obtaining a liquid-form insulating paste 1.

Example 2: Insulating Paste 2

The obtained silicone rubber-based curable composition 2 (elastomer composition 2) (32 parts by weight) was immersed in decane (68 parts by weight) and, subsequently, stirred with a planetary mixer, thereby obtaining a liquid-form insulating paste 2.

Example 3: Insulating Paste 3

The obtained silicone rubber-based curable composition 1 (elastomer composition 1) (32 parts by weight) was immersed in toluene (68 parts by weight) and, subsequently, stirred with a planetary mixer, thereby obtaining a liquid-form insulating paste 3.

Example 4: Insulating Paste 4

The obtained elastomer composition 4 (containing silica particles (7.0 parts by weight)) (32 parts by weight) was immersed in decane (68 parts by weight) and, subsequently, stirred with a planetary mixer, thereby obtaining a liquid-form insulating paste 4.

Example 5: Insulating Paste 5

The obtained elastomer composition 5 (32 parts by weight) was immersed in toluene (68 parts by weight) and, subsequently, stirred with a planetary mixer, thereby obtaining a liquid-form insulating paste 5.

Example 6: Insulating Paste 6

The obtained elastomer composition 1 (32 parts by weight) was immersed in mesitylene (68 parts by weight) and, subsequently, stirred with a planetary mixer, thereby obtaining a liquid-form insulating paste 6.

Example 7: Insulating Paste 7

The obtained elastomer composition 2 (32 parts by weight) was immersed in dipropylene glycol dimethyl ether (68 parts by weight) and, subsequently, stirred with a planetary mixer, thereby obtaining a liquid-form insulating paste 7.

Example 8: Insulating Paste 8

The obtained elastomer composition 1 (32 parts by weight) was immersed in diethyl carbonate (68 parts by weight) and, subsequently, stirred with a planetary mixer, thereby obtaining a liquid-form insulating paste 8.

Example 9: Insulating Paste 9

The obtained elastomer composition 1 (20 parts by weight) was immersed in tetradecane (80 parts by weight) and, subsequently, stirred with a planetary mixer, thereby obtaining a liquid-form insulating paste 9.

Example 10: Insulating Paste 10

The obtained elastomer composition 2 (40 parts by weight) was immersed in decane (60 parts by weight) and, subsequently, stirred with a planetary mixer, thereby obtaining a liquid-form insulating paste 10.

Comparative Example 1: Elastomer Composition

The obtained elastomer composition 1 (containing the silica particles (C) (25.6 parts by weight)) (100 parts by weight) was used as it was as a sample of Comparative Example 1 without being immersed in a solvent.

Comparative Example 2: Insulating Paste 11

The obtained elastomer composition 3 (containing no silica particles (C)) (32 parts by weight) was immersed in tetradecane (68 parts by weight) and, subsequently, stirred with a planetary mixer, thereby obtaining a liquid-form insulating paste 11.

TABLE 2

| | | Unit | Example 1 | Example 2 | Example 3 | Example 4 | Example 5 | Example 6 | Example 7 | Example 8 | Example 9 | Example 10 | Comparative Example 1 | Comparative Example 2 |
|---|---|---|---|---|---|---|---|---|---|---|---|---|---|---|
| | Insulating paste | Number | 1 | 2 | 3 | 4 | 5 | 6 | 7 | 8 | 9 | 10 | — | 11 |
| Elastomer composition | Elastomer composition 1 | Parts by weight | 32 | | 32 | | | 32 | | 32 | 20 | | 100 | |
| | Elastomer composition 2 | | | 32 | | | | | 32 | | | 40 | | |
| | Elastomer composition 3 | | | | | | | | | | | | | 32 |
| | Elastomer composition 4 | | | | | 32.0 | | | | | | | | |
| | Elastomer composition 5 | | | | | | 32 | | | | | | | |
| | Content of silica particles (C) in elastomer composition | | 8.2 | 11.8 | 8.2 | 7.0 | 8.2 | 8.2 | 11.8 | 8.2 | 5.1 | 14.8 | 25.6 | 0 |
| Solvent | Tetradecane | | 68 | | | | | | | | 80 | | | 68 |
| | Decane | | | 68 | | 68 | | | | | | 60 | | |
| | Toluene | | | | 68 | | 68 | | | | | | | |
| | Mesitylene | | | | | | | 68 | | | | | | |
| | Dipropylene glycol dimethyl ether | | | | | | | | 68 | | | | | |
| | Diethyl carbonate | | | | | | | | | 68 | | | | |
| | Total | | 100 | 100 | 100 | 100 | 100 | 100 | 100 | 100 | 100 | 100 | 100 | 100 |
| | Viscosity | Pa·s | 30 | 23 | 21 | 15 | 10 | 24 | 25 | 28 | 17 | 37 | — | 24 |
| | Thixotropy index | | 1.5 | 1.4 | 1.4 | 1.3 | 1.2 | 1.3 | 1.3 | 1.4 | 1.4 | 1.4 | — | 1.2 |
| | (Hardness) durometer hardness A | | 38 | 37 | 40 | 36 | 20 | 40 | 42 | 38 | 35 | 38 | — | 22 |
| | Tensile strength | MPa | 8.9 | 8.5 | 9.2 | 8.0 | 11 | 8.2 | 9.1 | 7.5 | 8.3 | 8.1 | — | 0.3 |
| | Tear strength | N/mm | 32 | 34 | 32 | 31 | 10 | 32 | 38 | 31 | 33 | 40 | — | 2 |
| | Film-forming property | | A | A | B | B | B | B | A | B | A | B | — | B |
| | Stretch durability | | A | A | A | A | B | A | A | A | A | A | — | C |

Regarding the Hansen solubility parameters (HSP) of the solvents in Table 2, for tetradecane, the dispersion term ($\delta_d$) was 15.8 MPa$^{1/2}$, the polarity term ($\delta_p$) was 0 MPa$^{1/2}$, and the hydrogen bond term ($\delta_h$) was 0 MPa$^{1/2}$, for decane, the dispersion term ($\delta_d$) was 15.7 MPa$^{1/2}$, the polarity term ($\delta_p$) was 0 MPa$^{1/2}$, and the hydrogen bond term ($\delta_h$) was 0 MPa$^{1/2}$, for toluene, the dispersion term ($\delta_d$) was 17.8 MPa$^{1/2}$, the polarity term ($\delta_p$) was 3.0 MPa$^{1/2}$, and the hydrogen bond term ($\delta_h$) was 0 MPa$^{1/2}$, for mesitylene, the dispersion term ($\delta_d$) was 18.0 MPa$^{1/2}$, the polarity term ($\delta_p$) was 0.6 MPa$^{1/2}$, and the hydrogen bond term ($\delta_h$) was 0.6 MPa$^{1/2}$, for dipropylene glycol dimethyl ether, the dispersion term ($\delta_d$) was 15.1 MPa$^{1/2}$, the polarity term ($\delta_p$) was 6.3 MPa$^{1/2}$, and the hydrogen bond term ($\delta_h$) was 4.9 MPa$^{1/2}$, and, for diethyl carbonate, the dispersion term ($\delta_d$) was 15.7 MPa$^{1/2}$, the polarity term ($\delta_p$) was 5.1 MPa$^{1/2}$, and the hydrogen bond term ($\delta_h$) was 3.5 MPa$^{1/2}$. In addition, the boiling point of tetradecane was 253° C., the boiling point of decane was 174° C., the boiling point of toluene was 111° C., the boiling point of mesitylene was 165° C., the boiling point of dipropylene glycol dimethyl ether was 175° C., and the boiling point of diethyl carbonate was 126° C.

In addition, "-" for Comparative Example 1 in Table 2 indicates that it was not possible to carry out the application operation on the sample of Comparative Example 1 and thus it was not possible to measure the individual evaluation items. Therefore, it was not possible to use the sample of Comparative Example 1 as a paste, and it was determined that Comparative Example 1 was poor in terms of applicability (film-forming property).

[Evaluation of Insulating Pastes]

The obtained insulating pastes 1 to 11 and the sample of Comparative Example 1 were evaluated according to the following items.

For the tensile strength, three samples were used, and the average value of three values was regarded as the measurement value. In addition, for the tear strength, five samples were used, and the average value of five values was regarded as the measurement value. Furthermore, for the hardness, two samples were used, measurement was carried out five times on each sample, and the average value of 10 measured values was regarded as the measurement value. For the respective evaluation items, Table 2 shows the average values.

<Production of Sheet-Like Elastomers>

Each of the obtained insulating pastes 1 to 11 and the sample of Comparative Example 1 was applied onto an aluminum foil that had undergone a mold release treatment in a size of 100×100 mm using a bar coater, cured at 170° C. for 120 minutes, and peeled from the aluminum foil, thereby preparing a sheet-like elastomer to be used in each evaluation.

<Viscosity>

For the obtained insulating pastes, the viscosities at room temperature (25° C.) and a shear rate of 20 [1/s] were measured using TPE-100H manufactured by Toki Sangyo Co., Ltd. immediately after the production of the insulating pastes. The unit of the viscosity is Pa·s.

<Thixotropy Index>

For the obtained insulating pastes, the viscosity measured at room temperature (25° C.) and a shear rate of 1 [1/s] using TPE-100H manufactured by Toki Sangyo Co., Ltd. was represented by η1, and the viscosity measured at room temperature (25° C.) and a shear rate of 5 [1/s] was represented by η5. The respective viscosities were measured immediately after the production of the insulating pastes. The unit of the viscosity is Pa·s. The thixotropy index was obtained as the viscosity ratio (η1/η5).

<Tensile Strength>

A dumbbell-like No. 3 test piece was produced in accordance with JIS K6251 (2004) using the obtained 1 mm-thick sheet-like elastomer of each of the examples and the comparative examples, and the tensile strength at room temperature (25° C.) of the obtained dumbbell-like No. 3 test piece was measured. The unit is MPa.

<Tear Strength>

A crescent-like test piece was produced in accordance with JIS K6252 (2001) using the obtained 1 mm-thick sheet-like elastomer of each of the examples and the comparative examples, and the tear strength at room temperature (25° C.) of the obtained crescent-like test piece was measured. The unit is N/mm.

<Hardness: Durometer Hardness A>

Six layers of the obtained 1 mm-thick sheet-like elastomer of each of the examples and the comparative examples were laminated together, thereby producing a 6 mm test piece. For the obtained test piece, the type-A durometer hardness at room temperature (25° C.) was measured in accordance with JIS K6253 (1997).

<Evaluation of Film-Forming Property>

The insulating paste of each of the examples and the comparative examples was applied onto a glass substrate in a size of 100×100 mm using a bar coater, and a film was formed such that the thickness after curing at 170° C. for 120 minutes fell in a range of approximately 100 μm. The thickness was measured at the center and the four corners of the obtained coating film, the variation (maximum film thickness value−minimum film thickness value) was evaluated, a film where the variation was equal to or less than 10 μm was evaluated A, a film where the variation was equal to or less than 20 μm was evaluated B, and a film where the variation was more than 20 μm was evaluated C. The results are shown in Table 2.

<Stretch Durability>

A dumbbell-like No. 3 test piece was produced in accordance with JIS K6251 (2004) using the obtained 1 mm-thick sheet-like elastomer.

Next, the following tensile repetition test was carried out. The results are shown in Table 2.

When a stretching operation was carried out to stretch the obtained dumbbell-like No. 3 test piece up to 500%, a test piece that could be stretched 500% was evaluated as A, a test piece that could be stretched 200% was evaluated as B, and a test piece that could be stretched equal to or less than 200% was evaluated as C.

Tester: Autograph AG5kNX (manufactured by Shimadzu Corporation, "Model No. AG-5kNX")

Initial value: 60 mm (distance between chucks), 0% stretch rate

At the time of stretching: 360 mm (distance between chucks), 500% stretch rate

Stretching speed: Maximum speed of 1,000 mm/min

It was found that the insulating pastes obtained in Examples 1 to 10 were excellent in terms of the applicability (film-forming property) compared with Comparative Example 1 and also excellent in terms of the stretch durability compared with Comparative Example 2, and furthermore, it is possible to obtain an insulating resin film having an excellent mechanical strength such as tensile strength or tear strength. It was found that such insulating pastes of Examples 1 to 10 were suitable for the formation of stretchable substrates.

What is claim is:

1. An insulating paste comprising:
   an elastomer composition comprising silica particles (C) surface treated with a coupling agent (D); and
   a solvent,
   wherein the silane coupling agent (D) includes a silane coupling agent having a hydrophobic group and a silane coupling agent having a vinyl group,
   wherein a content of the silica particles (C) is equal to or more than 5% by mass and equal to or less than 45% by mass with respect to an entire insulating paste, and
   wherein the insulating paste has a viscosity of equal to or more than 1 Pa·s and equal to or less than 100 Pas at room temperature (25° C.).

2. The insulating paste according to claim 1,
   wherein the elastomer composition comprises a thermosetting elastomer composition for forming one or more elastomers selected from the group consisting of silicone rubber, urethane rubber, and fluorine rubber.

3. The insulating paste according to claim 1,
   wherein the insulating paste is used to form a substrate that constitutes a stretchable wiring substrate.

4. The insulating paste according to claim 1,
   wherein the solvent comprises a high-boiling point solvent having a boiling point of equal to or higher than 100° C. and equal to or lower than 300° C.

5. The insulating paste according to claim 1,
   wherein the solvent comprises an aliphatic hydrocarbon having 5 to 20 carbon atoms.

6. The insulating paste according to claim 1,
   wherein the solvent comprises a first solvent in which a polarity term ($\delta_p$) of a Hansen solubility parameter is equal to or less than 10 MPa$^{1/2}$.

7. The insulating paste according to claim 1,
   wherein, in the insulating paste at room temperature (25° C.), in a case where a viscosity measured at a shear rate of 1 [1/s] is represented by η1, and a viscosity measured at a shear rate of 5 [1/s] is represented by η5, a thixotropy index which is a viscosity ratio (η1/η5) is equal to or more than 1.0 and equal to or less than 3.0.

8. The insulating paste according to claim 1,
   wherein the elastomer composition comprises a silicone rubber-based curable composition.

9. The insulating paste according to claim 8,
   wherein the silicone rubber-based curable composition comprises a vinyl group-containing organopolysiloxane (A).

10. The insulating paste according to claim 8,
    wherein the silicone rubber-based curable composition further comprises an organohydrogen polysiloxane (B).

11. The insulating paste according to claim 8,
    wherein the silicone rubber-based curable composition further comprises platinum or a platinum compound (E).

12. The insulating paste according to claim 1,
    wherein a content of the elastomer composition is equal to or more than 5% by mass and equal to or less than 50% by mass with respect to the entire insulating paste.

13. The insulating paste according to claim 1,
    wherein a durometer hardness A of an elastomer made from the insulating paste, which is specified in accordance with JIS K6253 (1997), is equal to or more than 10 and equal to or less than 70.

14. The insulating paste according to claim 1,
    wherein a tensile strength of an elastomer made from the insulating paste, which is measured in accordance with JIS K6251 (2004), is equal to or more than 5.0 MPa and equal to or less than 15 MPa.

15. The insulating paste according to claim 1,
    wherein a tear strength of an elastomer made from the insulating paste, which is measured in accordance with JIS K6252 (2001), is equal to or more than 25 N/mm.

16. The insulating paste according to claim 1,
    wherein the specific surface area of the silica particles (C) measured by a BET method is 100 to 400 m$^2$/g.

* * * * *